United States Patent
Akiike et al.

(10) Patent No.: US 10,815,564 B2
(45) Date of Patent: Oct. 27, 2020

(54) OXIDE SINTERED BODY AND TRANSPARENT CONDUCTIVE OXIDE FILM

(71) Applicant: TOSOH CORPORATION, Shunan-shi (JP)

(72) Inventors: Ryo Akiike, Ayase (JP); Yuya Tsuchida, Ayase (JP); Hideto Kuramochi, Ayase (JP)

(73) Assignee: TOSOH CORPORATION, Shunan-shi (JP)

( * ) Notice: Subject to any disclaimer, the term of this patent is extended or adjusted under 35 U.S.C. 154(b) by 0 days.

(21) Appl. No.: 16/078,488

(22) PCT Filed: Feb. 20, 2017

(86) PCT No.: PCT/JP2017/006045
§ 371 (c)(1),
(2) Date: Aug. 21, 2018

(87) PCT Pub. No.: WO2017/145964
PCT Pub. Date: Aug. 31, 2017

(65) Prior Publication Data
US 2019/0071768 A1 Mar. 7, 2019

(30) Foreign Application Priority Data

Feb. 22, 2016 (JP) ................................ 2016-031403
Nov. 16, 2016 (JP) ................................ 2016-223540

(51) Int. Cl.
| | | |
|---|---|---|
| *C23C 14/08* | (2006.01) | |
| *C23C 14/35* | (2006.01) | |
| *C04B 35/01* | (2006.01) | |
| *H01B 1/08* | (2006.01) | |
| *C23C 14/34* | (2006.01) | |
| *C03C 17/245* | (2006.01) | |
| *C04B 35/626* | (2006.01) | |
| *H01L 31/18* | (2006.01) | |
| *H01B 1/00* | (2006.01) | |
| *C04B 35/495* | (2006.01) | |
| *C04B 35/64* | (2006.01) | |
| *H01L 27/30* | (2006.01) | |
| *H01L 31/0224* | (2006.01) | |
| *H01L 31/0264* | (2006.01) | |
| *H01B 13/00* | (2006.01) | |

(52) U.S. Cl.
CPC ........ *C23C 14/3407* (2013.01); *C03C 17/245* (2013.01); *C04B 35/01* (2013.01); *C04B 35/495* (2013.01); *C04B 35/6261* (2013.01); *C04B 35/64* (2013.01); *C23C 14/08* (2013.01); *C23C 14/083* (2013.01); *C23C 14/086* (2013.01); *C23C 14/3414* (2013.01); *C23C 14/35* (2013.01); *H01B 1/00* (2013.01); *H01B 1/08* (2013.01); *H01B 13/0036* (2013.01); *H01L 27/301* (2013.01); *H01L 31/0224* (2013.01); *H01L 31/0264* (2013.01); *H01L 31/022425* (2013.01); *H01L 31/022466* (2013.01); *H01L 31/1884* (2013.01); *H01L 31/1888* (2013.01); *C03C 2217/23* (2013.01); *C03C 2218/156* (2013.01); *C04B 2235/3244* (2013.01); *C04B 2235/3251* (2013.01); *C04B 2235/3286* (2013.01); *C04B 2235/5427* (2013.01); *C04B 2235/5436* (2013.01); *C04B 2235/5445* (2013.01); *C04B 2235/602* (2013.01); *C04B 2235/604* (2013.01); *C04B 2235/6562* (2013.01); *C04B 2235/6565* (2013.01); *C04B 2235/6567* (2013.01); *C04B 2235/6583* (2013.01); *C04B 2235/662* (2013.01); *C04B 2235/72* (2013.01); *C04B 2235/77* (2013.01); *C04B 2235/785* (2013.01); *C04B 2235/786* (2013.01); *C04B 2235/96* (2013.01); *C04B 2235/963* (2013.01); *C04B 2235/9646* (2013.01); *C04B 2235/9653* (2013.01)

(58) Field of Classification Search
CPC ................... C23C 14/3407; H01J 37/3426
See application file for complete search history.

(56) References Cited

U.S. PATENT DOCUMENTS

| | | | | |
|---|---|---|---|---|
| 9,336,920 | B2 * | 5/2016 | Kuramochi | ............ C04B 35/01 |
| 2015/0187548 | A1 * | 7/2015 | Kuramochi | ............ C04B 35/01 |
| | | | | 252/519.15 |

FOREIGN PATENT DOCUMENTS

| | | |
|---|---|---|
| EP | 1 422 312 A1 | 5/2004 |
| EP | 2 883 979 A1 | 6/2015 |
| JP | 9-150477 A | 6/1997 |
| JP | 9-209134 A | 8/1997 |
| JP | 2003-105532 A | 4/2003 |
| JP | 3447163 B2 | 9/2003 |
| JP | 2004-149883 A | 5/2004 |
| JP | 3803132 B2 | 8/2006 |

(Continued)

OTHER PUBLICATIONS

International Search Report dated Apr. 11, 2017 in PCT/JP2017/006045, 2 pages.

(Continued)

*Primary Examiner* — Karl E Group
(74) *Attorney, Agent, or Firm* — Oblon, McClelland, Maier & Neustadt, L.L.P.

(57) ABSTRACT

An oxide sintered body containing indium, hafnium, tantalum, and oxygen as constituent elements, in which when indium, hafnium, and tantalum are designated as In, Hf, and Ta, respectively, the atomic ratio of Hf/(In+Hf+Ta) is equal to 0.002 to 0.030, and the atomic ratio of Ta/(In+Hf+Ta) is equal to 0.0002 to 0.013.

14 Claims, No Drawings

(56) References Cited

FOREIGN PATENT DOCUMENTS

| JP | 2011-6725 A | 1/2011 |
| JP | 2015-17017 A | 1/2015 |
| JP | 2015-160760 A | 9/2015 |
| WO | WO 2014/024986 A1 | 2/2014 |
| WO | WO 2015/136949 A1 | 9/2015 |

OTHER PUBLICATIONS

Utsumi, K., et al., "The Effect of $SnO_2$ Concentration on the Electrical and Optical Properties of $In_2O_3$-$SnO_2$ Films", TOSOH Research & Technology Review, vol. 47, Dec. 31, 2003, pp. 11-20 (with English abstract).

Extended European Search Report dated Oct. 15, 2019 in Patent Application No. 17756402.8, 7 pages.

International Preliminary Report on Patentability and Written Opinion dated Aug. 28, 2018 in PCT/JP2017/006045 filed Feb. 20, 2017 (English translation only).

* cited by examiner

OXIDE SINTERED BODY AND TRANSPARENT CONDUCTIVE OXIDE FILM

TECHNICAL FIELD

The present invention relates to an oxide sintered body, a sputtering target, a transparent conductive oxide film, and a method for producing the same.

BACKGROUND ART

Transparent conductive oxide films are utilized in the electrodes of display devices such as liquid crystal displays and of various light-receiving devices such as solar cells. Transparent conductive oxide films are also utilized in various fields such as heat-ray reflective films and antistatic films for automobiles and construction materials, and transparent heating devices for antifogging of refrigerated showcases and the like. Because those oxide films have low resistance while having relatively high transmittance in the visible light region. Among these, indium oxide films containing added tin are widely utilized as indium tin oxide (ITO) films.

In recent years, as a method for extracting device characteristics at the maximum, it has become very important to adjust electrical characteristics or optical characteristics according to requirements, and optimization of physical properties in accordance particularly with various usage applications, including display devices such as liquid crystal displays and solar cells, has been in active progress.

In regard to the ITO films described above, regulation of electrical characteristics and optical characteristics has been attempted by adjusting the amount of addition of tin. However, with this method, it has been difficult to simultaneously improve both of electrical characteristics such as resistance and optical characteristics such as transmittance and light absorptivity. For example, Non-Patent Literature 1 discloses the dependency of electro-optical characteristics on the amount of $SnO_2$ in an $In_2O_3$—$SnO_2$-based transparent conductive film. According to this, an $In_2O_3$—$SnO_2$-based transparent conductive film has the lowest resistance when the amount of $SnO_2$ is about 10 wt %. However, with such an amount of $SnO_2$, the plasma wavelength is shifted to the shorter wavelength side. Therefore, the absorptance is large in the infrared region, and the transmittance decreases.

In recent years, there are many of the above-described devices having a polymer film or an organic material incorporated into the device structure, and therefore, it is required to reduce the maximum temperature for the process of film-forming or device fabrication to a large extent compared to the current processes. Thus, there is a need for a transparent conductive film that can achieve low resistance at a temperature of 150° C. or lower, at which molecules such as liquid crystal molecules are not decomposed and many resins and polymer substrates can be used.

Patent Literatures 1 and 2 disclose oxide sintered bodies, each being formed from at least one elements selected from metal elements including indium, hafnium and tantalum, and oxygen. However, both of Patent Literatures 1 and 2 disclose only the case in which the above-mentioned metal elements are added singly.

Patent Literatures 3 and 4 disclose sputtering targets formed from indium oxide containing an insulating oxide, and hafnium oxide and tantalum oxide are mentioned as examples of the insulating oxide. However, none of the literatures describes an Example of adding hafnium oxide or tantalum oxide.

CITATION LIST

Patent Literature

Patent Literature 1: Japanese Unexamined Patent Publication No. H9-209134
Patent Literature 2: Japanese Unexamined Patent Publication No. H9-150477
Patent Literature 3: Japanese Unexamined Patent Publication No. 2003-105532
Patent Literature 4: Japanese Unexamined Patent Publication No. 2004-149883

Non Patent Literature

Non-Patent Literature 1: TOSOH Research & Technology Review, 47, pp. 11-20 (2003)

SUMMARY OF INVENTION

Technical Problem

An object of the present invention is to provide an oxide sintered body for a transparent conductive film, the oxide sintered body being capable of achieving low resistance even on a substrate that is structurally inseparable from an organic material or on an organic substrate during a low-temperature process at or below 150° C., a sputtering target, a transparent conductive film, and a substrate attached with the film, as well as methods for producing those.

Solution to Problem

In view of such circumstances, the inventors of the present invention conducted a thorough investigation, and as a result, the inventors found that when a particular element is added to indium oxide at a particular proportion, an oxide sintered body capable of forming a transparent conductive oxide film that realizes sufficiently low resistance in a production process in which the maximum temperature of a process for film-forming or device fabrication is suppressed to a low temperature, is obtained. Thus, the inventors completed the present invention.

That is, the present invention lies in the following items [1] to [6].

[1] An oxide sintered body having indium, hafnium, tantalum, and oxygen as constituent elements, in which when indium, hafnium, and tantalum are designated as In, Hf, and Ta, respectively, the atomic ratio of Hf/(In+Hf+Ta) is equal to 0.002 to 0.030, and the atomic ratio of Ta/(In+Hf+Ta) is equal to 0.0002 to 0.013.

[2] The oxide sintered body described in the above item [1], in which the relative density of the oxide sintered body is 97% or higher, and the average crystal grain size is 8 μm or less.

[3] The oxide sintered body described in the above item [1] or [2], in which the oxide sintered body includes unavoidable impurities at a proportion of less than 1 at %.

[4] A sputtering target consisting of the oxide sintered body described in any one of the above items [1] to [3].

[5] A method for producing a transparent conductive oxide film, the method including sputtering using the sputtering target described in the above item [4].

[6] A transparent conductive oxide film, in which when indium, hafnium, and tantalum are designated as In, Hf, and Ta, respectively, the atomic ratio of Hf/(In+Hf+Ta) is equal to 0.002 to 0.030, and the atomic ratio of Ta/(In+Hf+Ta) is equal to 0.0002 to 0.013.

Hereinafter, suitable embodiments of the present invention will be described below in detail.

The oxide sintered body of the present embodiment is such that when indium, hafnium, and tantalum are designated as In, Hf, and Ta, respectively, the atomic ratio of Hf/(In+Hf+Ta) is equal to 0.002 to 0.030, and the atomic ratio of Ta/(In+Hf+Ta) is equal to 0.0002 to 0.013. The unit "at %" according to the present specification means "atomic percentage (at %)". That is, the oxide sintered body of the present embodiment is such that the atomic ratio (ratio of the number of atoms) of Hf with respect to the sum of In, Hf, and Ta is equal to 0.002 to 0.030, and the atomic ratio (ratio of the number of atoms) of Ta with respect to the sum of In, Hf, and Ta is equal to 0.0002 to 0.013.

By adopting such a composition range, a transparent conductive oxide film capable of realizing sufficiently low resistance in a production process in which the maximum temperature of a process for film-forming or device fabrication is suppressed to a low temperature, can be formed.

From the viewpoint of being more suitable for a low-temperature process, the lower limit of Hf/(In+Hf+Ta) is preferably 0.005, and more preferably 0.007. From the same point of view, the upper limit of Hf/(In+Hf+Ta) is preferably 0.025.

From the viewpoint of being more suitable for a low-temperature process, the lower limit of Ta/(In+Hf+Ta) is preferably 0.001, and more preferably 0.002. From the same point of view, the upper limit of Ta/(In+Hf+Ta) is preferably 0.010.

According to the present embodiment, from the viewpoint of realizing low resistivity of the transparent conductive oxide film at a higher level, the ratio of Hf/(In+Hf+Ta) is preferably 0.005 to 0.025.

The content of indium in the oxide sintered body of the present embodiment is preferably 96 at % or higher, more preferably 97 at % or higher, and even more preferably 98 at % or higher, with respect to the sum of the metal elements.

The oxide sintered body and transparent conductive oxide film of the present embodiment may include a very small amount of unavoidable impurities. Examples of such impurities include compounds such as oxides having metal elements other than In, Hf, and Ta. The total content of these impurities in the oxide sintered body in terms of metal elements is preferably 1 at % or less, more preferably 0.5 at % or less, even more preferably 0.1 at % or less, and particularly preferably less than 0.05 at %, with respect to the sum of In, Hf, and Ta.

The relative density of the oxide sintered body of the present embodiment is preferably 97% or higher, and more preferably 99% or higher. In a case in which an oxide sintered body having such a relative density is used as a sputtering target, abnormal discharge during sputtering can be further reduced.

The relative density of the oxide sintered body of the present invention is calculated as follows. That is, In, Hf, and Ta are calculated in terms of oxides such as $In_2O_3$, $HfO_2$, and $Ta_2O_5$, respectively, and the weight proportions are determined. Here, the weight proportions of $In_2O_3$, $HfO_2$, and $Ta_2O_5$ thus determined are designated as a (%), b (%), and c (%), respectively. Next, for the respective true densities, the values of $In_2O_3$: 7.18 g/cm$^3$, $HfO_2$: 9.68 g/cm$^3$, and $Ta_2O_5$: 8.73 g/cm$^3$ are used to calculate the theoretical density A (g/cm$^3$).

$$A=(a+b+c)/((a/7.18)+(b/9.68)+(c/8.73))$$

The sintered density B (g/cm$^3$) of the oxide sintered body was measured by the Archimedean method according to JIS-R1634-1998.

The relative density (%) was determined by the following formula, as a relative value of the sintered density B (g/cm$^3$) with respect to the theoretical density A (g/cm$^3$) that had been arithmetically determined.

$$\text{Relative density (\%)}=(B/A)\times 100$$

The average crystal grain size of the oxide sintered body of the present invention is preferably 8 μm or less, and more preferably 6 μm or less. By having such an average crystal grain size, it is possible to increase the strength of the oxide sintered body. The lower limit of the average crystal grain size is preferably 0.01 μm, more preferably 0.5 μm, and even more preferably 2 μm, from the viewpoint of the ease of production.

Meanwhile, the measurement of the average crystal grain size of particles in the sintered body according to the present invention is carried out as follows. That is, the oxide sintered body of the present invention is cut into an appropriate size, subsequently a face to be observed is polished on the surface, subsequently chemical etching is carried out with a dilute hydrochloric acid solution, and the grain boundaries are clarified. For this sample, observation photographs of the polished surface of the sintered body are taken using EPMA, SEM/EDS, XRD, and the like. The lengths of the major axes of 500 or more particles in the observation photograph were determined, and the arithmetic average of the values was designated as the average crystal grain size.

Next, a method for producing the oxide sintered body of the present invention will be explained.

According to the present invention, the method for mixing raw material powders is not particularly limited, and the method includes a mixing step of preparing a mixed powder for molding including a powder that serves as an indium source, a powder that serves as a hafnium source, and a powder that serves as a tantalum source; a molding step of molding the mixed powder and producing a molded body; and a firing step of firing the molded body and obtaining an oxide sintered body.

In the following description, the various steps will be described in detail.

In the mixing step, a mixed powder including oxides of indium, hafnium, and tantalum is produced. According to the present embodiment, the method for mixing raw material powders is not particularly limited, and a powder that serves as an indium source, a powder that serves as a hafnium source, and a powder that serves as a tantalum source may be mixed simultaneously, or it is also acceptable to preliminarily mix some parts and then to add the remaining parts to the mixture so as to be mixed altogether.

Regarding the mixing method, a method of first preliminarily mixing a powder that serves as a hafnium source and a powder that serves as a tantalum source, and calcining the mixture, is preferred. The raw material powder is not particularly limited, and hafnium oxide and tantalum oxide are suitable; however, inorganic or organic salts, and the like of hafnium and tantalum that are converted to hafnium oxide and tantalum oxide by firing can also be used. Especially in consideration of handleability, oxide powders are suitably used. The particle size of these powders is such that in consideration of handleability, the average primary particle size is preferably 1.5 µm or less, and more preferably 0.1 µm to 1.5 µm. By using such powders, an effect of improving the density of the sintered body is obtained.

Here, the preliminary mixing method is not particularly limited; however, examples include mixing methods such as dry type or wet type medium agitating mills; mediumless container rotation mixing; and mechanical agitation mixing using balls or beads of zirconia, alumina, a nylon resin or the like. Specific examples include a ball mill, a bead mill, an attritor, a vibrating mill, a planetary mill, a jet mill, a V-shaped mixer, a paddle mixer, and a biaxial planetary stirring mixer. In the case of using a wet type ball mill or bead mill, an attritor, a vibrating mill, a planetary mill, a jet mill, or the like, it is necessary to dry the slurry after pulverization. This drying method is not particularly limited; however, for example, filtration drying, fluidized bed drying, and spray drying may be mentioned as examples. Furthermore, in a case in which a metal salt solution or an alkoxide solution is used as a raw material, a precipitate deposited from the solution is dried. It is preferable that the preliminarily mixed powder thus obtained is calcined at 800° C. to 1,200° C. The calcining temperature is more preferably 1,000° C. to 1,200° C., and the time is sufficient with 1 hour to 3 hours. The calcined powder thus obtained is subjected to a crushing treatment or the like, and the average primary particle size is adjusted to 0.5 µm or less. The treatment method for crushing or the like is not particularly limited; however, examples include mixing methods such as a dry type or wet type medium agitation mill using balls or beads of zirconia, alumina, a nylon resin, or the like. Specific examples include a ball mill, a bead mill, an attritor, a vibrating mill, a planetary mill, and a jet mill. Meanwhile, in the case of using a wet type ball mill or bead mill, an attritor, a vibrating mill, a planetary mill, a jet mill, or the like, it is necessary to dry the slurry after crushing. This drying method is not particularly limited; however, for example, filtration drying, fluidized bed drying, and spray drying may be mentioned as examples.

Next, an indium oxide powder and the preliminarily mixed powder are mixed so as to obtain the final composition, and thus a mixed powder for molding is obtained. When an indium oxide powder is used, complicatedness of the process or ancillary works such as a powdering treatment can be reduced. In a case in which the indium source is a compound other than oxide, for example, in a case in which the indium source is nitrate, chloride, or carbonate, the compound is calcined to be converted to oxide, and the oxide is used. Regarding the particle size of these powders, the average primary particle size is preferably 1.5 µm or less, and more preferably 0.1 µm to 1.5 µm, when handleability is considered. By using such powders, an effect of improving the density of the sintered body is obtained.

Here, the mixing method is not particularly limited; however, examples include mixing method such as dry type or wet type medium agitation mills; mediumless container rotation mixing; and mechanical agitation mixing using balls or beads of zirconia, alumina, a nylon resin, or the like. Specific examples include a ball mill, a bead mill, an attritor, a vibrating mill, a planetary mill, a jet mill, a V-shaped mixer, a paddle mixer, and a biaxial planetary stirring mixer. Meanwhile, in the case of using a wet type ball mill or bead mill, an attritor, a vibrating mill, a planetary mill, a jet mill, or the like, it is necessary to dry the slurry after pulverization. This drying method is not particularly limited; however, for example, filtration drying, fluidized bed drying, and spray drying may be mentioned as examples.

The powder thus obtained is adjusted to have an average primary particle size of 1.5 µm or less, and more preferably 0.1 µm to 1.5 µm, and this is used as a powder for molding. It is also possible to have the operability in molding processes further improved by a granulation treatment or the like. These operations provide an effect of improving moldability or sinterability.

In regard to the mixing step, it is preferable that the amounts of use of the powder that serves as an indium source, the powder that serves as a hafnium source, and the powder that serves as a tantalum source are in the following ranges when the composition (final composition) of the mixed powder for molding is represented by the atomic ratios of the metal elements. That is, $Hf/(In+Hf+Ta)$ is equal to 0.002 to 0.030, and $Ta/(In+Hf+Ta)$ is equal to 0.0002 to 0.013.

By adopting such a composition range, a transparent conductive oxide film capable of realizing sufficiently low resistance in a production process in which the maximum temperature of a process of film-forming or device fabrication is suppressed to a low temperature, can be formed.

In the molding step, the mixed powder for molding obtained in the mixing step is molded. Regarding the molding method, any molding method capable of achieving molding to an intended shape can be selected as appropriate, and there are no particular limitations. For example, a press molding method and a slip casting method may be mentioned as examples. The molding pressure can be set as appropriate to the extent that a molded body which can be handled without having the occurrence of cracks or the like can be produced, and there are no particular limitations. It is preferable that the molding density of the molded body is as high as possible. Therefore, it is also possible to use methods such as cold isostatic pressing (CIP). In this case, organic additives for improving moldability may be used as necessary.

In the case of using additives at the time of molding, it is preferable that a heating treatment is applied at a temperature of 80° C. to 500° C. before the firing step, in order to remove moisture or organic additives remaining in the molded body. This treatment temperature may be selected as appropriate according to the amounts and types of the moisture and additives remaining therein.

In the firing step, the molded body obtained in the molding step is fired. The rate of temperature increase is not particularly limited, and from the viewpoint of shortening the firing time and preventing cracking, the rate of temperature increase is preferably 10° C./hour to 400° C./hour. The retention temperature for sintering (sintering retention temperature) is preferably set to 1,400° C. or higher and lower than 1,650° C., and more preferably 1,500° C. or higher and 1,625° C. or lower. When such firing conditions are employed, an oxide sintered body having a higher density can be obtained. The retention time is preferably one hour or longer, and more preferably 3 hours to 10 hours. Thereby, an oxide sintered body having a higher density and a smaller average crystal grain size can be obtained. The rate of temperature decrease is not particularly limited as long as the rate is set in a normal range, and from the viewpoint of shortening the calcination time and preventing cracking, the rate of temperature decrease is preferably 10° C./hour to 500° C./hour.

The atmosphere at the time of firing is preferably an atmosphere containing oxygen. It is particularly preferable that firing is performed under an oxygen gas stream. Particularly, it is preferable that the ratio of the oxygen flow rate (L/min) at the time of introducing oxygen into the furnace upon sintering and the weight of the molded body (input amount, kg) (weight of molded body/oxygen flow rate) is adjusted to 1.0 [kg/(L/min)] or less. In this way, an oxide sintered body having a higher density can be obtained.

The method for producing the oxide sintered body of the present invention is not limited to the above-described method. For example, in the mixing step, a mixed powder for molding may be prepared by collecting and mixing a powder that serves as an indium source, a powder that serves as a hafnium source, and a powder that serves as a tantalum source, without performing preliminary mixing and calcining.

The sputtering target of the present embodiment consists of the oxide sintered body described above. Since such a sputtering target has excellent discharge characteristics at the time of film-forming, abnormal discharge is suppressed, and film-forming can be carried out stably. This sputtering target has a composition and a structure similar to those of the oxide sintered body.

According to the present embodiment, the oxide sintered body may be used directly as a sputtering target, or the oxide sintered body may be used as a sputtering target after being processed into a predetermined shape.

The surface roughness of the sputtering surface of the sputtering target is, as the center line average roughness (Ra), preferably 3μm or less, and more preferably 2 μm or less. Thereby, the number of times of abnormal discharge at the time of film-forming can be further suppressed, and stable film-forming can be carried out. The center line average roughness can be adjusted by, for example, a method of subjecting the surface of a composite oxide sintered body that serves as the sputtering surface to mechanical processing with grinding wheels of different mesh sizes, or a method of spray processing with a sandblast or the like. The center line average roughness can be determined by, for example, evaluating the surface to be measured, using a surface property analyzer.

A film can be formed by a sputtering method using the sputtering target of the present embodiment. Regarding the sputtering method, a DC sputtering method, an RF sputtering method, an AC sputtering method, a DC magnetron sputtering method, an RF magnetron sputtering method, an ion beam sputtering method, or the like can be selected as appropriate. Among these, a DC magnetron sputtering method and an RF magnetron sputtering method are preferred from the viewpoint that film-forming can be achieved uniformly in a large-sized area at a high speed.

The temperature at the time of sputtering is not particularly limited; however, the temperature is set as appropriate according to the heat resistance of the substrate used. For example, in the case of using alkali-free glass as a substrate, usually, the temperature is preferably set to 250° C. or lower, and in the case of using a film made of a resin as a substrate, usually, the temperature is preferably set to 150° C. or lower. In the case of using a substrate having excellent heat resistance, such as quartz, a ceramic, or a metal, it is also possible to form a film at a temperature higher than or equal to these temperatures.

Regarding the atmospheric gas at the time of sputtering, usually, an inert gas, for example, argon gas, is used. If necessary, oxygen gas, nitrogen gas, hydrogen gas, or the like may also be used.

The transparent conductive oxide film of the present embodiment can be obtained by forming a film by sputtering using the sputtering target described above. That is, the transparent conductive oxide film of the present embodiment can be obtained by carrying out a process of forming a film by sputtering a sputtering target consisting of an oxide sintered body.

The transparent conductive oxide film of the present embodiment can realize sufficiently lower resistance even in a production process in which the maximum temperature of a process for film-forming or device fabrication is suppressed to a low temperature such as a temperature below 200° C., and particularly below 180° C. Furthermore, a transparent conductive oxide film having excellent durability in a high-temperature or high-humidity environment can be obtained.

Regarding the composition of a transparent conductive oxide film that is obtainable by the method described above, the composition of the target used for sputtering is reflected. That is, by using a sputtering target formed from the oxide sintered body described above, a transparent conductive oxide film having a composition in which Hf/(In+Hf+Ta) is equal to 0.002 to 0.030, and Ta/(In+Hf+Ta) is equal to 0.0002 to 0.013, is obtained.

That is, the transparent conductive oxide film of the present embodiment has a composition similar to the compositions of the sputtering target and the oxide sintered body. Therefore, the transparent conductive oxide film contains an oxide having indium, hafnium, tantalum, and oxygen as constituent elements. Preferred ranges of the content of indium, the content of hafnium, and the content of tantalum in the transparent conductive oxide film are similar to those of the oxide sintered body.

From the viewpoint that sufficiently low resistance can be realized in a production process in which the maximum temperature of a process for film-forming of the transparent conductive oxide film of the present embodiment or device fabrication is suppressed to a low temperature, the lower limit of the ratio of Hf/(In+Hf+Ta) is preferably 0.005, and more preferably 0.007. From a similar viewpoint, the upper limit of the ratio of Hf/(In+Hf+Ta) is preferably 0.025, and more preferably 0.021.

From the viewpoint that sufficiently low resistance can be realized in a production process in which the maximum temperature of a process for film-forming of the transparent conductive oxide film of the present embodiment or device fabrication is suppressed to a low temperature, the lower limit of the ratio of Ta/(In+Hf+Ta) is preferably 0.001, and more preferably 0.003. From a similar viewpoint, the upper limit of the ratio of Ta/(In+Hf+Ta) is preferably 0.010.

According to the present embodiment, from the viewpoint of realizing low resistivity of the transparent conductive oxide film at a higher level, the ratio of Hf/(In+Hf+Ta) is preferably 0.005 to 0.025. Furthermore, the ratio of Ta/(In+Hf+Ta) is preferably 0.001 to 0.010.

The transparent conductive oxide film is used in a form having an appropriate film thickness according to the usage application. For example, when the transparent conductive oxide film is used as an electrode for various light-receiving devices such as a solar cell; a TFT or CF of a display device; a transparent electrode of an organic EL device; or the like, a transparent conductive oxide film having a film thickness of about 100 nm to 300 nm is used in many cases. In usage applications in a display device such as a liquid crystal display, or particularly a touch panel, a flexible substrate that uses a polymer film is employed in many cases, in addition to a glass substrate. In such usage applications, the transparent conductive oxide film is used as a very thin film having a film thickness of about 5 nm to 50 nm. Furthermore, due to have a structure having a material with low heat resistance laminated thereon or to use a polymer film, it is required that the maximum temperature of the film-forming process is suppressed to a low temperature.

The transparent conductive oxide film of the present invention can be suitably used as a laminated substrate including a substrate and the transparent conductive oxide film thus configured.

Here, examples of the substrate include a glass substrate including alkali-free glass, quartz or the like; a polymer film substrate made of a resin; and a substrate of a ceramic or a metal. Particularly, in the case of being used for display devices, since visibility is extremely important, a glass substrate containing alkali-free glass or quartz, or a polymer film substrate made of a resin is suitable.

Such a laminated substrate is suitably used as a device configured to include a plurality of functional components. For example, the laminated substrate is suitable for an optical device such as a solar cell, or a display device such as an FPD or a touch panel. Particularly, the display devices mentioned above are incorporated into electronic equipment and suitably used, and are particularly suitable for small-sized high-performance electronic equipment such as mobile equipment.

Thus, suitable embodiments of the present invention have been described; however, the present invention is not intended to be limited to the above-described embodiments.

Advantageous Effects of Invention

The oxide sintered body of the present invention can be used as a sputtering target. By sputtering using the target, the transparent conductive oxide film of the present invention can be produced while abnormal discharge during sputtering is suppressed. Since the transparent conductive oxide film of the present invention can achieve very low resistivity such as 300 $\mu\Omega\cdot cm$ even at a process temperature of 150° C. or lower, generally the production processes for electronic devices are facilitated, and also, the transparent conductive oxide film can be suitably used in devices that use organic substrates or in organic semiconductor devices.

EXAMPLE

The present invention will be described more specifically by referring to the following Examples; however, the present invention is not intended to be limited to these Examples.

Examples 1 to 20

Sintered bodies, sputtering targets, and transparent conductive films were produced according to the compositions indicated in Table 1 by the following methods.

<Production of Oxide Sintered Body>

As raw material powders, an indium oxide powder having a purity of 99.99% by weight and an average particle size of 0.5 μm, a hafnium oxide powder having a purity of 99.9% by weight and an average particle size of 0.2 μm, and a tantalum oxide powder having a purity of 99.9% by weight and an average particle size of 0.2 μm were prepared. These raw material powders were weighed so as to obtain the atomic ratio described in Table 1, the powders were mixed in a dry type ball mill, and thus a mixed powder for molding was obtained. The average particle size of the mixed powder was 0.2 μm.

This mixed powder was molded by the following procedure, and a molded body was produced. First, the mixed powder was molded using a mold having a diameter of 150 mm by applying pressure at 0.3 ton/cm². Next, CIP molding of applying pressure at 3.0 ton/cm² was performed, and thus a cylindrical-shaped molded body was obtained. This molded body was disposed in a sintering furnace conditioned to have a pure oxygen atmosphere, and the molded body was sintered under the following conditions. Thus, a disc-shaped oxide sintered body was produced. In this manner, the oxide sintered bodies of the various Examples, various Comparative Examples, and various Reference Examples were obtained. The retention time is the time for which the molded body was maintained at the sintering retention temperature.

(Firing Conditions)
Rate of temperature increase: 50° C./hour
Sintering retention temperature: 1,600° C.
Retention time: 5 hours
Sintering atmosphere: From before the initiation of temperature increase (room temperature) to the temperature reached 100° C. upon temperature decrease, pure oxygen gas was introduced into the furnace.
Rate of temperature decrease: 100° C./hour
Weight of molded body/oxygen flow rate: 0.9 [kg/(L/min)]

<Evaluation of Oxide Sintered Body>

(Composition)

The compositions of the oxide sintered bodies of the various Examples, various Comparative Examples, and various Reference Examples were quantitatively determined by ICP emission spectrometry using a commercially available ICP emission spectrometer. Then, the atomic ratio was determined. The results are shown in Table 1. Meanwhile, the compositions of the oxide sintered bodies were respectively almost identical with the compositions of the mixed powders for molding.

(Relative Density)

The relative densities of the oxide sintered bodies of the various Examples, various Comparative Examples, and various Reference Examples were determined. The relative density is a value that is determined by the following formula, when the theoretical density of the oxide sintered body is designated as A and the sintered density is designated as B. The methods for measuring the theoretical density A and the sintered density B are as described above. The measurement results are shown in Table 1.

$$\text{Relative density (\%)}=(B/A)\times 100$$

(Average Crystal Grain Size)

The average crystal grain sizes of the crystal grains that constituted the oxide sintered bodies of the various Examples, various Comparative Examples, and various Reference Examples were measured. The method for measuring the average crystal grain size is as described above. However, an observation photograph (magnification ratio: 1,000 to 5,000 times) of a polished surface of an oxide sintered body was taken using a scanning electron microscope. In this observation photograph, the lengths of the major axes of 500 particles were determined. The arithmetic mean length of the major axes thus determined was designated as the average crystal grain size. The measurement results are shown in Table 1.

(Three-Point Flexural Strength)

Regarding the strength of a sintered body, the three-point flexural strength was measured according to JIS-R-1601.

<Production of Sputtering Target and Transparent Conductive Oxide Film>

The oxide sintered bodies produced in the various Examples, various Comparative Examples, and various Reference Examples were processed into a disc shape (diameter: 4 inches=101.6 mm) The surface that will be served as a sputtering surface when the oxide sintered body was used as a sputtering target was polished using a flat surface grinding machine and a diamond grinding wheel. The center line average roughness (Ra) was adjusted by changing the mesh size of the grinding wheel at the time of polishing. In this manner, a sputtering target was produced. Ra of the sputtering surface of the sputtering target thus produced was measured using a commercially available surface property analyzer (apparatus name: SURF TEST SV-3100, manufactured by Mitutoyo Corporation). The results were as shown in Table 1.

A film was formed on a substrate under the following conditions by a DC magnetron sputtering method using the sputtering target thus obtained. After the film-forming, a post-treatment was carried out under the following conditions, and a transparent conductive oxide film was obtained.

(Film-Forming Conditions)
Apparatus: DC magnetron sputtering apparatus
Magnetic field intensity: 1,000 Gauss (right above the target, horizontal component)
Substrate temperature: Room temperature (25° C.)
Attained degree of vacuum: $8 \times 10^{-5}$ Pa
Atmosphere at the time of film-forming: Argon
Gas pressure at the time of sputtering: 0.5 Pa
DC power: 200 W
Film thickness: 30 nm
Substrate used: Alkali-free glass (EAGLE XG glass manufactured by Corning Incorporated, thickness: 0.7 mm)

(Post-Treatment Conditions after Film-Forming)
After the film-forming, the transparent conductive film-attached substrate was subjected to a heat treatment of heating for 60 minutes at 150° C. in air. The rate of temperature increase at this time was set to 50° C./min.

<Evaluation of Transparent Conductive Oxide Film>
(Film Thickness)
The thickness of the thin film was measured using DEK-TAK 3030 (manufactured by Sloan Technology Corp.).

(Resistivity)
The resistivity of the thin film was measured using HL5500 (manufactured by Japan Bio-Rad Laboratories, Inc.).

(Light Transmittance)
The light transmittance of a sample having a transparent conductive oxide film formed on a substrate was measured using a spectrophotometer (trade name: U-4100, manufactured by Hitachi High-Technologies Corporation) in a wavelength range of from 240 nm to 2,600 nm, and the average value of the light transmittances at a wavelength of 400 nm to 800 nm, which is important for display devices, was determined.

The measurement results for the resistivity and the light transmittance of the transparent conductive films thus obtained are shown in Table 1.

Comparative Examples 1 to 10

Sintered bodies, sputtering targets, and transparent conductive films were produced by methods similar to those used in Examples 1 to 20, according to the compositions indicated in Table 1.

Reference Example 1

A sintered body, a sputtering target, and a transparent conductive film were produced according to the composition indicated in Table 1 by methods similar to those used in Examples 1 to 20, except that the retention time during firing was set to 15 hours.

Reference Example 2

A sintered body, a sputtering target, and a transparent conductive film were produced according to the composition indicated in Table 1 by methods similar to those used in Examples 1 to 20, except that the retention time during firing was set to 25 hours.

The measurement results are shown in Table 1.

TABLE 1

| | Final composition of powder and composition of sintered body | | Relative density of sintered body (%) | Average crystal grain size of sintered body (μm) | Three-point flexural strength (MPa) | Ra of target (μm) | Annealing temperature (° C.) | Resistivity (μΩ·cm) | Light transmittance in wavelength range of 400 to 800 nm (%) |
|---|---|---|---|---|---|---|---|---|---|
| | Hf/(In + Hf + Ta) | Ta/(In + Hf + Ta) | | | | | | | |
| Example 1 | 0.0110 | 0.0012 | 99.2 | 5.2 | 195 | 0.42 | 150 | 259 | 88.0 |
| Example 2 | 0.0157 | 0.0018 | 99.2 | 5.2 | 196 | 0.48 | 150 | 233 | 88.2 |
| Example 3 | 0.0120 | 0.0018 | 99.2 | 5.6 | 190 | 0.47 | 150 | 253 | 88.3 |
| Example 4 | 0.0150 | 0.0015 | 99.1 | 5.2 | 191 | 0.47 | 150 | 231 | 88.4 |
| Example 5 | 0.0160 | 0.0018 | 99.1 | 5.3 | 191 | 0.42 | 150 | 237 | 88.4 |
| Example 6 | 0.0200 | 0.0022 | 99.1 | 5.2 | 193 | 0.42 | 150 | 268 | 88.3 |
| Example 7 | 0.0180 | 0.0017 | 99.1 | 5.1 | 196 | 0.42 | 150 | 260 | 88.1 |
| Example 8 | 0.0235 | 0.0018 | 99.2 | 5.4 | 189 | 0.42 | 150 | 279 | 87.5 |
| Example 9 | 0.0235 | 0.0018 | 99.2 | 5.2 | 190 | 0.42 | 150 | 273 | 87.3 |
| Example 10 | 0.0072 | 0.0018 | 99.3 | 5.7 | 189 | 0.42 | 150 | 266 | 88.4 |
| Example 11 | 0.0072 | 0.0035 | 99.4 | 4.8 | 200 | 0.45 | 150 | 284 | 88.3 |
| Example 12 | 0.0055 | 0.0010 | 99.1 | 3.5 | 280 | 0.41 | 150 | 299 | 88.4 |
| Example 13 | 0.0280 | 0.0050 | 99.3 | 5.2 | 189 | 0.42 | 150 | 294 | 87.3 |
| Example 14 | 0.0235 | 0.0033 | 99.3 | 5.0 | 193 | 0.43 | 150 | 282 | 87.3 |
| Example 15 | 0.0150 | 0.0040 | 99.3 | 5.2 | 189 | 0.42 | 150 | 224 | 87.0 |
| Example 16 | 0.0148 | 0.0050 | 99.3 | 4.8 | 200 | 0.42 | 150 | 226 | 87.0 |
| Example 17 | 0.0190 | 0.0060 | 99.3 | 5.0 | 203 | 0.45 | 150 | 218 | 87.3 |
| Example 18 | 0.0190 | 0.0070 | 99.3 | 4.2 | 230 | 0.42 | 150 | 220 | 86.9 |
| Example 19 | 0.0190 | 0.0093 | 99.3 | 4.5 | 212 | 0.42 | 150 | 214 | 85.9 |
| Example 20 | 0.0170 | 0.0090 | 99.3 | 4.9 | 204 | 0.42 | 150 | 212 | 86.3 |

TABLE 1-continued

|  | Final composition of powder and composition of sintered body | | Relative density of sintered body (%) | Average crystal grain size of sintered body (μm) | Three-point flexural strength (MPa) | Ra of target (μm) | Annealing temperature (° C.) | Resistivity (μΩ · cm) | Light transmittance in wavelength range of 400 to 800 nm (%) |
|---|---|---|---|---|---|---|---|---|---|
|  | Hf/ (In + Hf + Ta) | Ta/ (In + Hf + Ta) | | | | | | | |
| Comparative Example 1 | 0.0320 | 0.0018 | 99.0 | 5.3 | 190 | 0.47 | 150 | 314 | 87.2 |
| Comparative Example 2 | 0.0240 | 0.0140 | 99.4 | 4.8 | 200 | 0.42 | 150 | 362 | 87.4 |
| Comparative Example 3 | 0.0004 | 0.0010 | 99.1 | 5.3 | 189 | 0.45 | 150 | 462 | 88.8 |
| Comparative Example 4 | 0.0310 | 0.0080 | 99.2 | 5.9 | 178 | 0.42 | 150 | 518 | 87.2 |
| Comparative Example 5 | 0.0070 | — | 98.8 | 4.9 | 200 | 0.38 | 150 | 345 | 88.2 |
| Comparative Example 6 | 0.0120 | — | 99.1 | 5.5 | 189 | 0.38 | 150 | 301 | 87.5 |
| Comparative Example 7 | 0.0300 | — | 99.1 | 5.2 | 200 | 0.40 | 150 | 309 | 86.4 |
| Comparative Example 8 | — | 0.0020 | 99.3 | 5.3 | 192 | 0.41 | 150 | 441 | 88.4 |
| Comparative Example 9 | — | 0.0145 | 98.8 | 5.1 | 198 | 0.40 | 150 | 323 | 87.5 |
| Comparative Example 10 | — | 0.0230 | 99.0 | 5.1 | 203 | 0.40 | 150 | 385 | 87.4 |
| Reference Example 1 | 0.0150 | 0.0040 | 99.8 | 9.0 | 110 | 0.40 | 150 | 227 | 87.4 |
| Reference Example 2 | 0.0190 | 0.0050 | 99.8 | 15.0 | 96 | 0.40 | 150 | 227 | 87.4 |

Reference Example 3

A sintered body, a sputtering target, and a transparent conductive film were produced by methods similar to those used in Examples 1 to 20, except that the additive element was changed to Sn. The evaluation results are shown in Table 2. From these results, it is understood that the present invention can achieve low resistance at a low-temperature process, even when compared to $In_2O_3$ (ITO) having added Sn, which is currently generally used.

TABLE 2

|  | Final composition of powder and composition of sintered body | | Relative density of sintered body (%) | Average crystal grain size of sintered body (μm) | Three-point flexural strength (MPa) | Ra of target (μm) | Annealing temperature (° C.) | Resistivity (μΩ · cm) | Light transmittance in wavelength range of 400 to 800 nm (%) |
|---|---|---|---|---|---|---|---|---|---|
|  | Additive element M | M/(In + M) | | | | | | | |
| Reference Example 3 | Sn | 0.0270 | 99.0 | 3.9 | 215 | 0.42 | 150 | 331 | 86.7 |

The present invention has been explained in detail with reference to particular embodiments; however, it is clearly known to those having ordinary skill in the art that various modifications or corrections can be added without deviating from the essence and scope of the present invention.

Meanwhile, the entire disclosures of the specifications, claims, drawings, and abstracts of Japanese Patent Application No. 2016-031403, filed on Feb. 22, 2016, and Japanese Patent Application No. 2016-223540, filed on Nov. 16, 2016, are incorporated herein by reference as disclosures of the specification of the present invention.

INDUSTRIAL APPLICABILITY

According to the present invention, a sputtering target and an oxide sintered body that is suitably used as a sputtering target can be provided. By sputtering using the sputtering target, a transparent conductive oxide film can be produced while target damage during film-forming is suppressed. The transparent conductive oxide film of the present invention can realize low resistance in a production process in which the maximum temperature of a process for film-forming of the transparent conductive oxide film or device fabrication is suppressed to a low temperature. Therefore, for example, when the transparent conductive oxide film is used in a solar cell, optical losses and heat generation caused by light absorption can be suppressed compared to conventional cases. Furthermore, since the transparent conductive oxide film of the present invention has low resistivity and high transmittance when produced in a low-temperature film-forming process, the transparent conductive oxide film can be suitably used in touch panel applications where flexible substrates such as films are used, in addition to glass substrates. Furthermore, since the transparent conductive oxide film of the present invention has high durability, the transparent conductive oxide film can be suitably used for various device usage applications.

The invention claimed is:

1. An oxide sintered body, comprising:
   an oxide including indium, hafnium, tantalum, and oxygen as constituent elements,
   wherein the oxide satisfies that an atomic ratio of Hf/(In+Hf+Ta) is equal to 0.002 to 0.030, and that an atomic ratio of Ta/(In+Hf+Ta) is equal to 0.0002 to 0.013, where In, Hf, and Ta are indium, hafnium, and tantalum, respectively.

2. The oxide sintered body according to claim 1, wherein the oxide sintered body has a relative density of 97% or higher and an average crystal grain size of 8 μm or less.

3. The oxide sintered body according to claim 1, wherein the oxide sintered body includes unavoidable impurities at a proportion of less than 1 at %.

4. A sputtering target, consisting of the oxide sintered body according to claim 1.

5. A method for producing a transparent conductive oxide film, comprising:
   conducting sputtering with the sputtering target according to claim 4.

6. The oxide sintered body according to claim 1, wherein the atomic ratio of Hf/(In+Hf+Ta) is equal to 0.005 to 0.025.

7. The oxide sintered body according to claim 1, wherein the atomic ratio of Hf/(In+Hf+Ta) is equal to 0.007 to 0.021.

8. The oxide sintered body according to claim 1, wherein the atomic ratio of Ta/(In+Hf+Ta) is equal to 0.001 to 0.010.

9. The oxide sintered body according to claim 1, wherein the atomic ratio of Ta/(In+Hf+Ta) is equal to 0.003 to 0.010.

10. The oxide sintered body according to claim 1, wherein the atomic ratio of Hf/(In+Hf+Ta) is equal to 0.005 to 0.025, and the atomic ratio of Ta/(In+Hf+Ta) is equal to 0.001 to 0.010.

11. The oxide sintered body according to claim 2, wherein the average crystal grain size is 0.5 μm-6 μm.

12. The oxide sintered body according to claim 2, wherein the average crystal grain size is 2 μm-6 μm.

13. A sputtering target, comprising:
    the oxide sintered body according to claim 1.

14. A method for producing a transparent conductive oxide film, comprising:
    conducting sputtering with the sputtering target according to claim 13.

* * * * *